(12) United States Patent
Ohashi et al.

(10) Patent No.: US 7,560,854 B2
(45) Date of Patent: Jul. 14, 2009

(54) PIEZOELECTRIC ELEMENT AND ITS MANUFACTURING METHOD

(75) Inventors: Koji Ohashi, Suwa (JP); Masao Nakayama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/075,976

(22) Filed: Mar. 13, 2008

(65) Prior Publication Data

US 2008/0224569 A1    Sep. 18, 2008

(30) Foreign Application Priority Data

Mar. 13, 2007    (JP)    ............... 2007-063306

(51) Int. Cl.
*B41J 2/045*    (2006.01)
(52) U.S. Cl. ............... 310/328; 347/68; 347/70; 347/72
(58) Field of Classification Search ......... 310/363–366, 310/328; 347/68–72
See application file for complete search history.

(56) References Cited

U.S. PATENT DOCUMENTS

| | | | | |
|---|---|---|---|---|
| 5,376,857 | A  * | 12/1994 | Takeuchi et al. | ............ 310/328 |
| 7,348,711 | B2 * | 3/2008  | Ikeda et al.    | ................ 310/328 |
| 2005/0052504 | A1* | 3/2005 | Murai | ........................ 347/71 |
| 2006/0262165 | A1* | 11/2006 | Murai | ........................ 347/68 |

FOREIGN PATENT DOCUMENTS

| | | |
|---|---|---|
| JP | 2005-318017 | 11/2005 |
| JP | 2007-006620 | 1/2007 |
| JP | 2007173691 A * | 7/2007 |

\* cited by examiner

*Primary Examiner*—Jaydi SanMartin
(74) *Attorney, Agent, or Firm*—Edwards Angell Palmer & Dodge LLP

(57) ABSTRACT

A piezoelectric element includes: a base substrate; a lower electrode provided above the base substrate; a lower dummy electrode provided on the base substrate and electrically insulated from the lower electrode; a piezoelectric layer provided on the base substrate, the lower electrode and the lower dummy electrode; and an upper electrode provided on the piezoelectric layer.

3 Claims, 4 Drawing Sheets

PIEZOELECTRIC ELEMENT AND ITS MANUFACTURING METHOD

The entire disclosure of Japanese Patent Application No. 2007-063306, filed Mar. 13, 2007 is expressly incorporated by reference herein.

BACKGROUND OF THE INVENTION

1. Field of the Invention

The present invention relates to piezoelectric elements, and methods for manufacturing the same.

2. Description of the Related Art

In general, piezoelectric elements have a structure in which a piezoelectric composed of inorganic oxide is interposed between two electrodes. The piezoelectric element is capable of electromechanical conversion in which deformation is generated in the piezoelectric by applying an electric filed across the electrodes. The piezoelectric expands and contracts according to electrical signals applied through the electrodes. Polycrystal sintered materials such as lead zirconate titanate (PZT) may be representative as the piezoelectric materials.

A piezoelectric body may be damaged by repeated extension and contraction operations. For example, in the case of a piezoelectric actuator described in JP-A-2007-006620 having a structure in which a part of a piezoelectric layer is interposed between two electrodes, the single piezoelectric layer has a portion that is operated and another portion that is not operated. The potion of the piezoelectric layer that does not expand or contract may be damaged due to stress caused by expansion and contraction of the portion that expands and contracts. In particular, in the case where the lower electrode is disposed on the inner side more inside than the outer periphery of the bottom portion of the piezoelectric layer, the size of crystal grains (grain size) of the sintered body of piezoelectric material formed on the lower electrode is generally different from the grain size of piezoelectric body that is not formed on the lower electrode.

According to the study conducted by the inventor, it is found that smaller grains are formed in a portion of a piezoelectric layer that is formed on an electrode, and larger grains are formed in a portion of a piezoelectric layer that is not formed on an electrode. Therefore, in the above-described example, larger grains are formed in the portion where the piezoelectric layer does not operate, such that stress would likely concentrate at interfaces of the grains in this non-operating portion, which lowers the mechanical strength and makes the layer more susceptible to damage.

SUMMARY OF THE INVENTION

In accordance with an advantage of some aspects of the invention, a highly reliable piezoelectric element without having larger grains in its piezoelectric body and its manufacturing method are provided.

A piezoelectric element in accordance with an embodiment of the invention includes: a base substrate; a lower electrode provided above the base substrate; a lower dummy electrode provided on the base substrate and electrically insulated from the lower electrode; a piezoelectric layer provided on the base substrate, the lower electrode and the lower dummy electrode; and an upper electrode provided on the piezoelectric layer.

According to the piezoelectric element with the structure described above, grains are small in size and uniform throughout the piezoelectric layer, and therefore stress concentration is unlikely to occur in the non-operating portion of the piezoelectric body and damage is difficult to be inflicted.

The piezoelectric element in accordance with an aspect of the embodiment of the invention, the distance between the lower electrode and the lower dummy electrode may be 30 nm or more but 1000 nm or less.

The piezoelectric element in accordance with an aspect of the embodiment of the invention may further include a protection layer that covers at least the piezoelectric layer.

A method for manufacturing a piezoelectric element in accordance with an embodiment of the invention includes the steps of: forming a lower electrode layer on a base substrate; conducting a first patterning to remove a portion of the lower electrode layer to divide the lower electrode layer into a lower electrode and a lower dummy electrode; forming a piezoelectric layer on the base substrate, the lower electrode and the lower dummy electrode; forming an upper electrode on the piezoelectric layer; and conducting a second patterning to pattern at least the upper electrode and the piezoelectric layer by etching.

According to the method described above, it is possible to obtain a highly reliable piezoelectric element in which its piezoelectric layer does not have large size grains throughout the layer and stress concentration is hard to occur in the non-operating portion of the piezoelectric body.

In the method for manufacturing a piezoelectric element in accordance with an aspect of the embodiment of the invention, the step of forming the piezoelectric layer may include repeating a coating and drying step to coat and dry a piezoelectric source material a plurality of times, and the method may further include a crystallization annealing step to crystallize the piezoelectric material at least once after one of the coating and drying steps.

In the method for manufacturing a piezoelectric element in accordance with an aspect of the embodiment of the invention, the step of forming the piezoelectric layer may further include the step of forming a seed layer of the piezoelectric layer by conducting the coating and drying step and the crystallization anneal step at least once, after the step of forming the lower electrode layer but before the step of conducting the first patterning.

DESCRIPTION OF EXEMPLARY EMBODIMENTS

Exemplary embodiments of the invention are described below with reference to the accompanying drawings. It is noted that the embodiment described below is an example of the invention.

1. Piezoelectric Element

Figure 1:
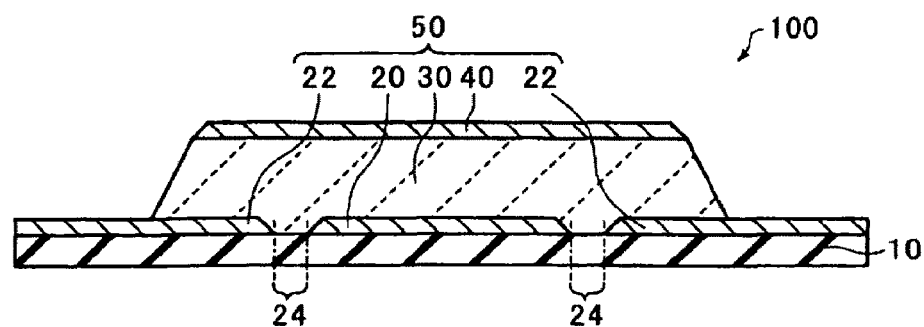
FIG. 1 is a schematic cross-sectional view of a piezoelectric element 100 in accordance with an embodiment of the invention.
Figure 2:
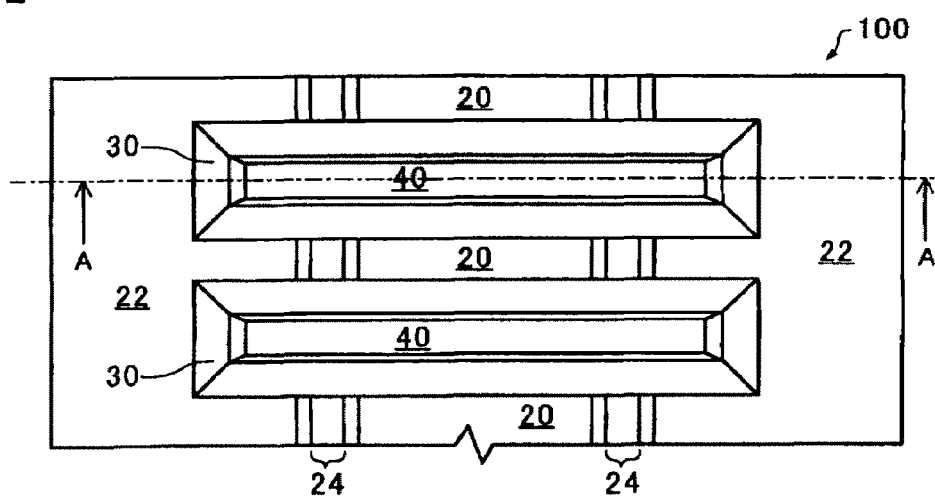
FIG. 2 is a schematic plan view of the piezoelectric element 100 in accordance with the embodiment of the invention.
Figure 3:
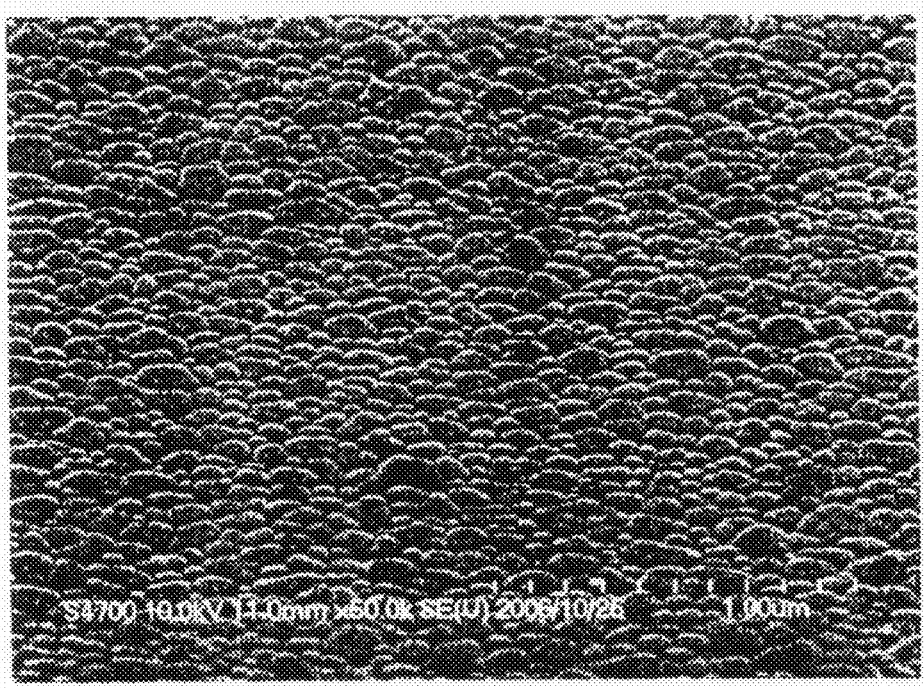
FIG. 3 is a SEM image showing the result of observation of the surface of a piezoelectric body that is annealed for crystallization on an electrode.
Figure 4:
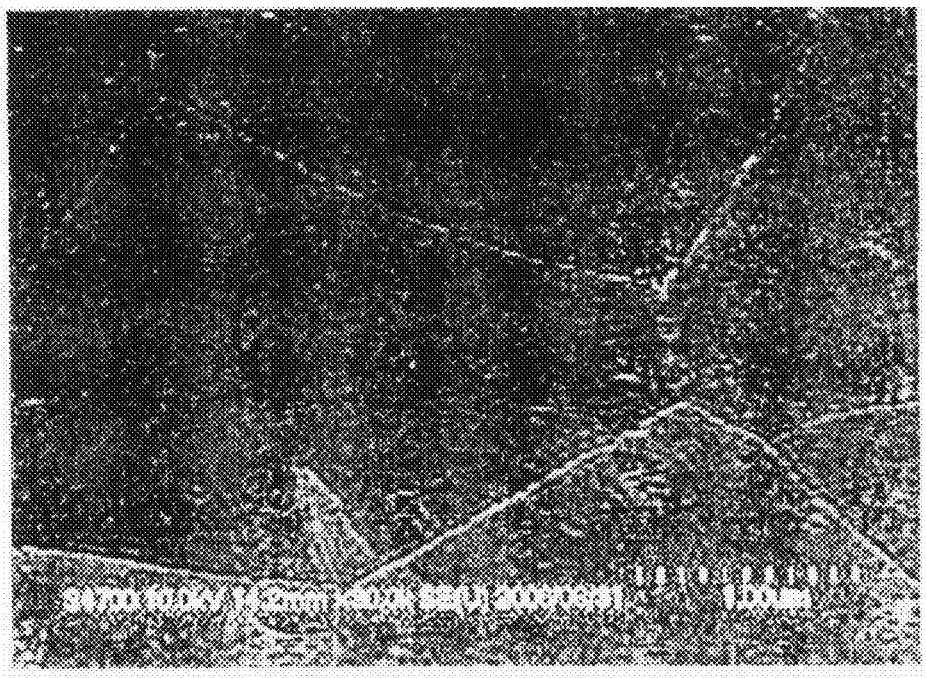
FIG. 4 is a SEM image showing the result of observation of the surface of a piezoelectric body that is annealed for crystallization on a base substrate.

FIG. 1 is a schematic cross-sectional view of a piezoelectric element 100 in accordance with an embodiment of the invention. FIG. 1 is a cross-sectional view taken along a line A-A of FIG. 2. FIG. 2 is a schematic plan view of the piezoelectric element 100 in accordance with the embodiment of the invention. FIG. 3 and FIG. 4 are photographs showing the results of observation of the surfaces of piezoelectric bodies conducted by a scanning electron microscope.

The piezoelectric element 100 includes a base substrate 10, a lower electrode 20, a lower dummy electrode 22, a piezoelectric layer 30 and an upper electrode 40.

The base substrate 10 is a member for providing mechanical outputs when the piezoelectric element 100 is operated. The base substrate 10 may include, for example, a vibration plate, thereby functioning as a movable part of the liquid jet head, or may form a part of a wall of a pressure generation chamber. The base substrate 10 is capable of warping and vibrating by the operation of the piezoelectric layer 30. The thickness of the base substrate 10 may be optimally selected according to the coefficient of elasticity of the material used and the like. The material for the base substrate 10 may preferably include a material having high rigidity and mechanical strength. As the material for the base substrate 10, for example, inorganic oxides such as zirconium oxide, silicon nitride, silicon oxide and the like, metal such as nickel, stainless steel and the like, and semiconductor such as silicon may preferably be used. The base substrate 10 may have a laminate structure of layers of two or more materials.

As shown in FIG. 1 and FIG. 2, in accordance with the present embodiment, a portion including a part of the lower electrode 20, a part of the dummy electrode 22, the piezoelectric layer 30 and the upper electrode 40 is referred to as a capacitor structure 50. The piezoelectric element 100 may include a plurality of capacitor structures 50, as shown in FIG. 2.

The lower electrode 20 is provided on the base substrate 10. The lower electrode 20 pairs with the upper electrode 40 to function as one of the electrodes that interpose the piezoelectric layer 30. The lower electrode 20 may be formed commonly with the lower electrode 20 of the next capacitor structure 50, for example, as shown in FIG. 2. The lower electrode 20 is electrically connected to an external circuit not shown. The lower electrode 20 may have any appropriate thickness as long as deformation in the piezoelectric layer 30 can be transmitted to the base substrate 10. The thickness of the lower electrode 20 may be, for example, between 50 nm and 300 nm. The lower electrode 20, when the piezoelectric layer 30 is formed on its top surface, has a function to reduce the size of grains of the piezoelectric body, and a function to improve the crystal orientation of the piezoelectric body. The lower electrode 20 may be formed from any material having conductivity that satisfies the aforementioned functions, without any particular limitation. For example, as the material for the lower electrode 20, a variety of metals such as nickel, iridium, platinum, titanium and the like, conductive oxides of the aforementioned metals (for example, iridium oxide), strontium ruthenium complex oxide (SRO), lanthanum nickel complex oxide (LNO) and the like may be used. Also, the lower electrode 20 may be in a single layer of any of the materials, or in a laminate structure of layers of a plurality of the materials exemplified above.

The lower dummy electrode 22 is formed on the base substrate 10. The lower dummy electrode 22 may be formed commonly with the lower dummy electrode 22 of the next capacitor structure 50, for example, as shown in FIG. 2. At least a part of the piezoelectric layer 30 is formed on the lower dummy electrode 22. The lower dummy electrode 22 is electrically insulated from the lower electrode 20. The lower dummy electrode 22 and the lower electrode 20 are separated by a slit 24 thereby being electrically insulated from each other. The shape of the slit 24 may be linear or curved. The number of the slits 24 is two in the example shown in FIG. 2, but may be one or plural. The width of the slit 24 may be such that the lower dummy electrode 22 and the lower electrode 20 are insulated from each other, and for example, 30 nm or more. If the width of the slit 24 is less than 30 nm, the insulation may not be sufficient. Also, if the width of the slit 24 is greater than 1000 nm, the effect of the lower dummy electrode 22 may not be sufficiently obtained.

The lower dummy electrode 22 has a function to reduce the size of grains of the piezoelectric layer 30 to be formed thereon, like the lower electrode 20. The lower dummy electrode 22 may be formed from any conductive material that satisfies the aforementioned function, without any particular limitation. For example, as the material for the lower dummy electrode 22, a variety of metals such as nickel, iridium, platinum, titanium and the like, conductive oxides of the aforementioned metals (for example, iridium oxide), strontium ruthenium complex oxide, lanthanum nickel complex oxide and the like may be used. Also, the lower dummy electrode 22 may be in a single layer of any of the materials, or in a laminate structure of layers of a plurality of the materials exemplified above. The thickness, material and layered structure of the lower dummy electrode 22 may be similar to those of the lower electrode 20.

The piezoelectric layer 30 is provided on the base substrate 10, the lower electrode 20 and the lower dummy electrode 22. The thickness of the piezoelectric layer 30 may be 500 nm to 3000 nm. Upon application of an electric field by the lower electrode 20 and the upper electrode 40, the piezoelectric layer 30 expands or contracts by its deformation, thereby warping or vibrating the base substrate 10. The piezoelectric layer 30 may be formed from a material having piezoelectricity. As the material for the piezoelectric layer 30, perovskite type oxides expressed by a general formula $ABO_3$ (A includes Pb, and B includes Zr and Ti) are favorably used. For example, lead zirconate titanate (PZT) and lead zirconate titanate niobate (PZTN) have good piezoelectric performance, and therefore are preferable as the material for the piezoelectric layer 30.

Portions of the piezoelectric layer 30 that are located above the lower electrode 20 and the lower dummy electrode 22 have smaller grains. On the other hand, portions of the piezoelectric layer 30 that are located on the base substrate 10, in other words, the portion provided inside the slit 24, have grains larger than those on the electrodes. The grain size in this portion depends on the width of the slit 24, and smaller than the width of the slit 24. Therefore, for example, when the width of the slit 24 is 1000 nm, the piezoelectric in this portion has grains whose maximum grain size may be 1000 nm. In this case, the piezoelectric layer 30 has grains with a largest grain size of 1000 nm or less throughout the layer. When the grain size of grains of the piezoelectric layer 30 is greater than 1000 nm, the effect of dispersing stress and suppressing damage cannot be sufficiently obtained. Therefore the width of the slit 24 may preferably be 1000 nm or less.

If the upper surface of the lower electrode 20 is formed from LNO or SRO, the orientation of crystal of the piezoelectric layer 30 thereon can be improved. For example, when the piezoelectric layer 30 is formed from PZT, the piezoelectric performance of the piezoelectric element 100 becomes favorable when the crystal of PZT is oriented in the <100> direction along the direction in which the upper and lower electrodes oppose each other. Such an orientation state is hereafter referred to as "<100> crystal orientation." By forming LNO and SRO in <100> crystal orientation, the degree of <100> crystal orientation of the piezoelectric layer 30 to be formed thereon can be made higher. In other words, when the upper surface of the lower electrode 20 is formed from LNO or SRO, the grain size of crystal grains of the piezoelectric layer 30 to be formed thereon can be made smaller, and the crystal orientation of the piezoelectric layer 30 can be made better.

FIG. 3 shows the state of the surface of piezoelectric that is annealed for crystallization on the electrode. FIG. 4 shows the state of the surface of piezoelectric that is annealed for crystallization on the base substrate. Referring to FIG. 3, the surface appears to be divided into 100 nm to 200 nm size segments. On the other hand, referring to FIG. 4, the surface appears to be divided into about 3 μm to about 5 μm size segments. In either of the states, each of the segments indicates a crystal grain particle (grain). As shown in FIG. 3, the piezoelectric that is annealed for crystallization on the lower electrode 20 and the lower dummy electrode 22 has grains with grain sizes ranging from about 100 nm to about 200 nm. In contrast, as shown in FIG. 4, the piezoelectric that is annealed for crystallization on the base substrate 10 has grains with grain sizes ranging from about 3 μm to about 5 μm. According to the piezoelectric element 100 in accordance with the present embodiment, the grain size of grains in the piezoelectric layer 30 is about 100 nm to about 200 nm on the lower electrode 20 and the lower dummy electrode 22, and is smaller than the width of the slit 24 on the base substrate 10. Therefore, the grain size of grains of the piezoelectric layer 30 is smaller than the width of the slit 24 throughout the piezoelectric layer 30.

The upper electrode 40 is provided on the piezoelectric layer 40. The upper electrode 40 pairs with the lower electrode 20 to function as the other of the electrodes. The thickness of the upper electrode 40 may be, for example, between 50 nm and 200 nm. The upper electrode 40 may be formed from any material having conductivity that satisfies the aforementioned functions, without any particular limitation. For example, as the material for the upper electrode 40, a variety of metals such as nickel, iridium, gold, platinum, titanium and the like, conductive oxides of the aforementioned metals (for example, iridium oxide), strontium ruthenium complex oxide (SRO), lanthanum nickel complex oxide (LNO) and the like may be used. Also, the upper electrode 40 may be in a single layer of any of the materials, or in a laminate structure of layers of a plurality of the materials exemplified above.

According to the piezoelectric element 100 in accordance with the present embodiment, the lower dummy electrode 22 is provided as a method for reducing the size of grains of the piezoelectric layer 30. According to the study conducted by the inventor, it is found that stress is dispersed when the size of grains is smaller than a predetermined size. The piezoelectric element 100 in accordance with the present embodiment has small grains throughout the piezoelectric layer 30. Therefore, according to the piezoelectric element 100 in accordance with the present embodiment, when stress is generated in the piezoelectric layer 30, the stress is difficult to concentrate at grain boundaries among the grains, and the piezoelectric layer 30 is difficult to be damaged.

Figure 5:
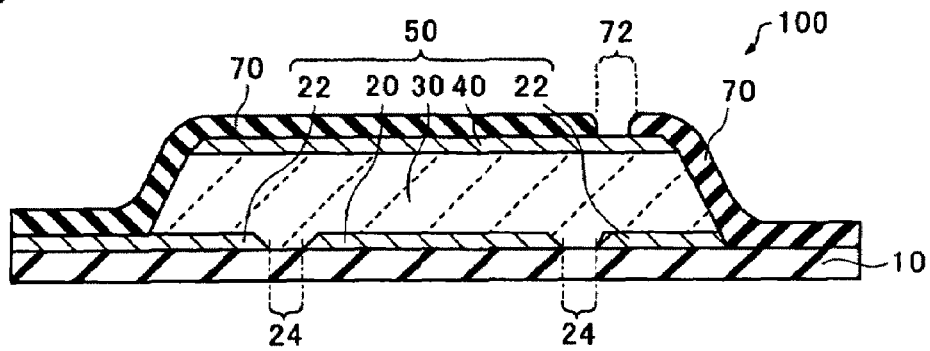
FIG. 5 is a schematic cross-sectional view of a piezoelectric element 100 in accordance with a modified example of the invention.
Figure 6:
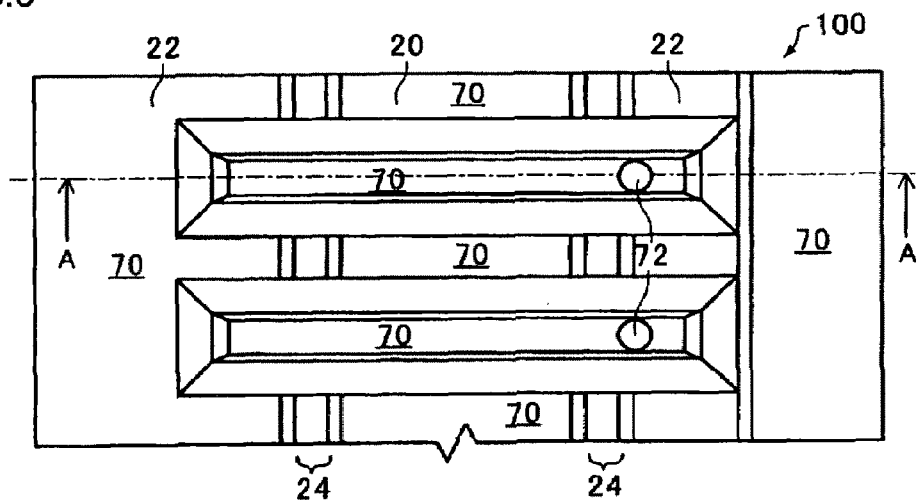
FIG. 6 is a schematic plan view of the piezoelectric element 100 in accordance with the modified example of the invention.

Many changes can be made in the piezoelectric element 100 in accordance with the present embodiment. FIG. 5 is a schematic cross-sectional view of a piezoelectric element 100 in accordance with a modified example of the embodiment. FIG. 5 is a cross-sectional view taken along a line A-A of FIG. 6. FIG. 6 is a schematic plan view of the piezoelectric element 100 in accordance with the modified example of the embodiment.

The piezoelectric element 100 may further include a protection layer 70 that covers at least the piezoelectric layer 30. When the protection layer 70 is provided above the upper electrode 40, the protection layer 70 may be provided with an opening section 72, for example, above the upper electrode 40 for wiring the upper electrode 40. The protection layer 70 has a function to prevent the piezoelectric layer 30 from deterioration caused by impurities including hydrogen, water and compound containing carbon that may be diffused from outside into the piezoelectric layer 30. The protection layer 70 may preferably have a thickness greater than a thickness that provides the aforementioned barrier property, but have a thickness that would not inhibit the operation of the piezoelectric element 100. The protection layer 70 may be formed from any material having barrier property and insulation property, and may preferably be formed from aluminum oxide, for example.

2. Method for Manufacturing Piezoelectric Element

FIGS. 7 to 11 are schematic cross-sectional views showing steps of a method for manufacturing a piezoelectric element 100 shown in FIG. 1.

The method for manufacturing a piezoelectric element 100 in accordance with the present embodiment includes a step of forming a lower electrode layer, a first patterning step, a step of forming a piezoelectric layer, a step of forming an upper electrode, and a second patterning step.

Figure 7:
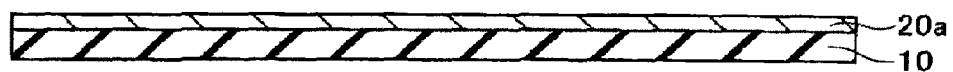
FIG. 7 is a schematic cross-sectional view showing a step of a method for manufacturing a piezoelectric element 100 in accordance with an embodiment of the invention.

As shown in FIG. 7, first, a base substrate 10 is prepared, and a lower electrode layer 20a is formed on the base substrate 10. The lower electrode layer 20a may be formed by, for example, a sputter method, a vacuum deposition method, a CVD method or the like.

Figure 8:
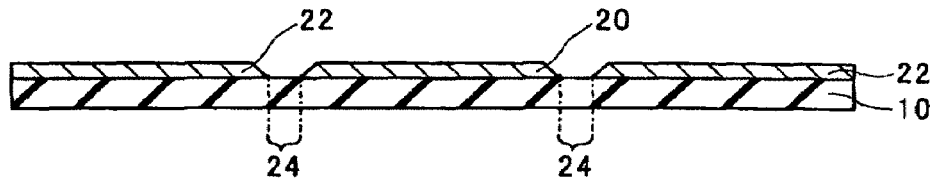
FIG. 8 is a schematic cross-sectional view showing a step of the method for manufacturing the piezoelectric element 100 in accordance with the embodiment of the invention.

Next, as shown in FIG. 8, the lower electrode layer 20a is etched, thereby conducing the first patterning step to separate the lower electrode layer 20a into a lower electrode 20 and a lower dummy electrode 22. The lower electrode layer 20a may be etched by a photolithography method or the like. By this step, slits 24 are formed, and the lower electrode 20 and the lower dummy electrode 22 are separated from each other.

In the illustrated example, two slits 24 are formed, but one slit or three or more slits may be formed. Also, the slit 24 may be linear or curved in shape.

Figure 9:
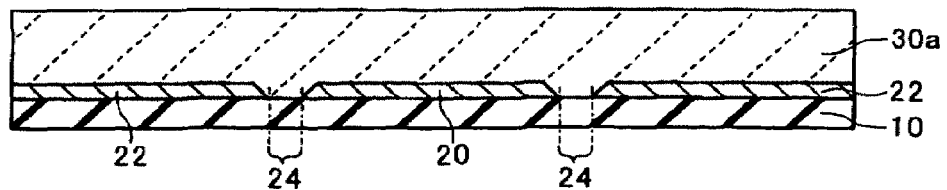
FIG. 9 is a schematic cross-sectional view showing a step of the method for manufacturing the piezoelectric element 100 in accordance with the embodiment of the invention.

Next, as shown in FIG. 9, a piezoelectric layer 30a is formed on the base substrate 10, in other words, on the slits 24, the lower electrode 20 and the lower dummy electrode 22. The piezoelectric layer 30a may be formed by a sol-gel method, a CVD method, a sputter method or the like. In the sol-gel method, the coating and drying step to coat and dry a piezoelectric source material is repeated a plurality of times, and the crystallization anneal step to crystallize the piezoelectric material may be conducted at least once after one of the coating and drying steps. The coating and drying step may be repeated a plurality of times until the total thickness of the layers reaches a desired film thickness. In the crystallization annealing step, the piezoelectric on the lower electrode 20 and the lower dummy electrode 22 is formed to have grains with small grain sizes.

Figure 10:
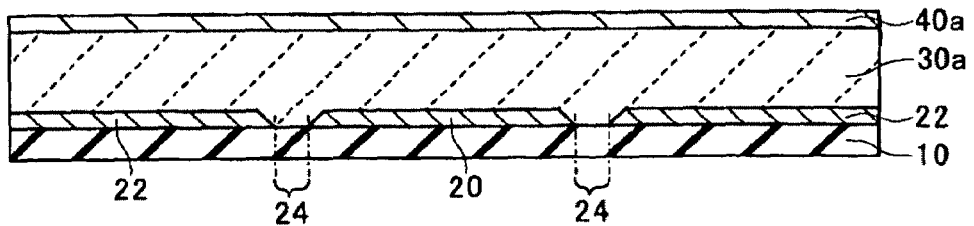
FIG. 10 is a schematic cross-sectional view showing a step of the method for manufacturing the piezoelectric element 100 in accordance with the embodiment of the invention.

Next, as shown in FIG. 10, an upper electrode layer 40a is formed on the piezoelectric layer 30a. The upper electrode layer 40a may be formed by, for example, a sputter method, a vacuum deposition method, a CVD method or the like.

Figure 11:
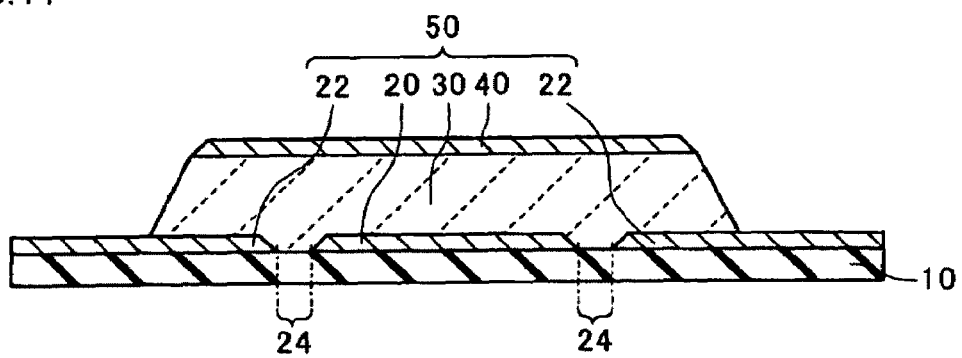
FIG. 11 is a schematic cross-sectional view showing a step of the method for manufacturing the piezoelectric element 100 in accordance with the embodiment of the invention.

Then, as shown in FIG. 11, at least the upper electrode layer 40a and the piezoelectric layer 30a are etched, thereby conducting the second patterning step which forms a capacitor structure 50 including a lower electrode 20, a lower dummy electrode 22, a piezoelectric layer 30 and an upper electrode 40. The second patterning step may be conducted using a mask by a photolithography method or the like. Also, in the second patterning step, photolithography may be conducted a plurality of times. The etching in this step may be performed by a known dry etching method or the like. By this step, portions of the lower electrode 20 and the lower dummy electrode 22 that extend out the lower surface of the piezoelectric layer 30 may be removed.

In this manner, the piezoelectric element 100 is fabricated. The manufacturing method in accordance with the present embodiment may appropriately include other steps of forming other layers between adjacent steps, conducting a surface treatment, and the like. For example, when a protection layer 70 shown in FIG. 5 is provided, for example, after the second patterning step, the step of providing a protection layer 70 by a known method such as a CVD method, and the step of forming a through hole 72 in the protection film 70 above the upper electrode 40 if necessary may be added. The step of forming a protection layer 70 may be performed by a known method such as a CVD method, and the step of forming a through hole 72 may be performed by a known method such as photolithography.

Figure 12:
FIG. 12 is a schematic cross-sectional view showing a step of the method for manufacturing the piezoelectric element 100 in accordance with the embodiment of the invention.
Figure 13:
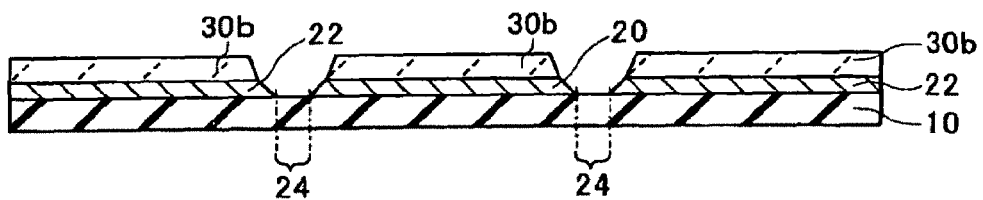
FIG. 13 is a schematic cross-sectional view showing a step of the method for manufacturing the piezoelectric element 100 in accordance with the embodiment of the invention.
Figure 14:
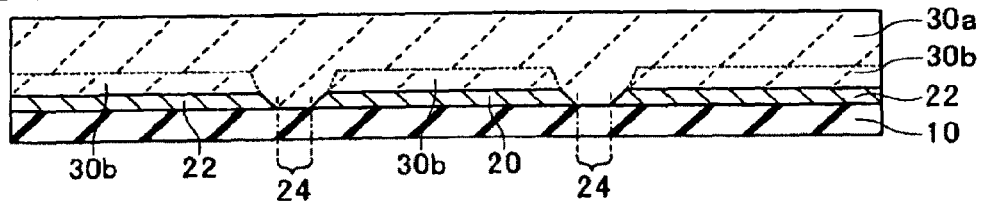
FIG. 14 is a schematic cross-sectional view showing a step of the method for manufacturing the piezoelectric element 100 in accordance with the embodiment of the invention.

Also, when the step of forming a piezoelectric layer 30 is conducted by a sol-gel method, as shown in FIGS. 12 to 14, the method may further include, after the step of forming the lower electrode layer 20a, but before the first patterning step, the step of conducting the coating and drying step and the crystallization anneal step at least once for forming a seed layer 30b of the piezoelectric layer 30. As a result, as shown in FIG. 12, a piezoelectric layer 30a can be provided on the lower electrode layer 20a, before the first patterning step. In this case, the coating and drying step is conducted one or more times, in a manner that the maximum formed layers would not reach a final film thickness of the piezoelectric layer 30. Then the crystallization annealing step is performed in the state in which the piezoelectric layer 30a has undergone the coating and drying step. Then, as shown in FIG. 13, the first patterning step is applied to the lower electrode layer 20a and the piezoelectric layer 30a. As a result, laminates having seed layers 30b on the separated lower electrode 20 and lower dummy electrode 22 are formed. Then, the coating and drying step, and the crystallization annealing step if necessary are conducted to form a piezoelectric layer 30a on the base substrate 10 and the seed layers 30b, thereby obtaining a laminate shown in FIG. 14. The piezoelectric layer 30a and the seed layers 30b shown in FIG. 14 are integrated into one piece as they are composed of the same material, which thus becomes the same as the piezoelectric layer 30a shown in FIG. 9.

The degree of orientation of the piezoelectric layer 30a formed on the lower electrode layer 20a depends on the continuity of the lower electrode layer 20a in the transverse direction. Accordingly, if the crystallization annealing step is performed for the first time after the slits 24 have been formed in the lower electrode layer 20a by the first patterning step, the degree of <100> crystal orientation of the piezoelectric layer 30a may be lowered as the continuity of the lower electrode layer 20a in the transverse direction is lowered, compared to the case without the slits 24. In particular, when the top surface of the lower electrode layer 20a is formed from metal, the aforementioned tendency becomes more significant. In contrast, when the top surface of the lower electrode layer 20a is formed from metal, and the piezoelectric layer 30a is formed by conducting the crystallization annealing step before the first patterning step, the piezoelectric layer 30a is annealed and crystallized on the lower electrode layer 20a that is not patterned (see FIG. 12), the degree of <100> crystal orientation of crystals of the piezoelectric layer 30, in other words, the seed layer 30b can be increased.

According to the method for manufacturing a piezoelectric element 100 in accordance with the present embodiment, a highly reliable piezoelectric element 100 in which the piezoelectric layer 30 does not have large grains throughout the layer, and stress concentration is hard to occur in non-operating portions of the piezoelectric can be obtained by a relatively simple process.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A piezoelectric element comprising:
   a base substrate;
   a lower electrode provided above the base substrate;
   a lower dummy electrode provided on the base substrate and electrically insulated from the lower electrode;
   a piezoelectric layer provided on the base substrate, the lower electrode and the lower dummy electrode; and
   an upper electrode provided on the piezoelectric layer.

2. A piezoelectric element according to claim 1, wherein the distance between the lower electrode and the lower dummy electrode is 30 nm or more but 1000 nm or less.

3. A piezoelectric element according to claim 1 or claim 2, further comprising a protection layer that covers at least the piezoelectric layer.

* * * * *